(12) United States Patent
Acosta Alba et al.

(10) Patent No.: US 11,508,613 B2
(45) Date of Patent: Nov. 22, 2022

(54) METHOD OF HEALING AN IMPLANTED LAYER COMPRISING A HEAT TREATMENT PRIOR TO RECRYSTALLISATION BY LASER ANNEALING

(71) Applicant: COMMISSARIAT A L'ENERGIE ATOMIQUE ET AUX ENERGIES ALTERNATIVES, Paris (FR)

(72) Inventors: Pablo Acosta Alba, Grenoble (FR); Shay Reboh, Grenoble (FR)

(73) Assignee: COMMISSARIAT A LENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 190 days.

(21) Appl. No.: 16/993,894

(22) Filed: Aug. 14, 2020

(65) Prior Publication Data

US 2021/0057267 A1 Feb. 25, 2021

(30) Foreign Application Priority Data

Aug. 20, 2019 (FR) ..................................... 19 09297

(51) Int. Cl.
*H01L 21/762* (2006.01)
*H01L 21/02* (2006.01)
*H01L 21/324* (2006.01)

(52) U.S. Cl.
CPC .. *H01L 21/76254* (2013.01); *H01L 21/02686* (2013.01); *H01L 21/3247* (2013.01)

(58) Field of Classification Search
None
See application file for complete search history.

(56) References Cited

U.S. PATENT DOCUMENTS

| 9,246,006 B2 | 1/2016 | Batude et al. |
| 9,343,375 B2 | 5/2016 | Batude et al. |
| 9,431,538 B2 | 8/2016 | Reboh et al. |
| 9,502,558 B2 | 11/2016 | Reboh, et al. |
| 9,704,709 B2 | 7/2017 | Augendre et al. |
| 9,761,607 B2 | 9/2017 | Reboh et al. |
| 9,876,121 B2 | 1/2018 | Barraud et al. |

(Continued)

FOREIGN PATENT DOCUMENTS

EP 2 551 897 A1 1/2013

OTHER PUBLICATIONS

U.S. Appl. No. 16/535,367, filed Aug. 8, 2019, 2020/0058768 A1, Coquand, R, et al.

(Continued)

*Primary Examiner* — Alexander G Ghyka
(74) *Attorney, Agent, or Firm* — Oblon, McClelland, Maier & Neustadt, L.L.P.

(57) ABSTRACT

The invention relates to a method of healing defects related to implantation of species in a donor substrate (1) made of a semiconducting material to form therein a plane of weakness (5) in it separating a thin layer (4) from a bulk part of the donor substrate. The method comprises a superficial amorphisation of the thin layer, followed by application of a heat treatment on the superficially amorphised thin layer. The method comprises application of laser annealing to the superficially amorphised thin layer after the heat treatment, to recrystallise it in the solid phase.

13 Claims, 1 Drawing Sheet

E1

E2

E3

E4

E5

E6

(56) References Cited

U.S. PATENT DOCUMENTS

| | | |
|---|---|---|
| 9,899,217 B2 | 2/2018 | Reboh et al. |
| 9,935,019 B2 | 4/2018 | Reboh et al. |
| 9,966,453 B2 | 5/2018 | Reboh et al. |
| 10,014,183 B2 | 7/2018 | Reboh et al. |
| 10,115,590 B2 | 10/2018 | Reboh et al. |
| 10,141,424 B2 | 11/2018 | Coquand et al. |
| 10,147,818 B2 | 12/2018 | Reboh et al. |
| 10,170,621 B2 | 1/2019 | Reboh et al. |
| 10,205,021 B1 | 2/2019 | Reboh |
| 10,217,842 B2 | 2/2019 | Reboh et al. |
| 10,217,849 B2 | 2/2019 | Barraud et al. |
| 10,263,077 B1 | 4/2019 | Reboh et al. |
| 10,269,930 B2 | 4/2019 | Reboh et al. |
| 10,347,721 B2 | 7/2019 | Reboh et al. |
| 10,431,683 B2 | 10/2019 | Reboh et al. |
| 10,553,723 B2 | 2/2020 | Coquand et al. |
| 10,600,786 B2 | 3/2020 | Maitrejean et al. |
| 2001/0026835 A1* | 10/2001 | Tanaka ................ H01L 21/2026 438/149 |
| 2007/0281172 A1 | 12/2007 | Couillard et al. |
| 2010/0216295 A1 | 8/2010 | Usenko |

OTHER PUBLICATIONS

U.S. Appl. No. 16/580,396, filed Sep. 24, 2019, 2020/0098859 A1, Reboh, S, et al.

U.S. Appl. No. 16/590,557, filed Oct. 2, 2019, 2020/0111872 A1, Reboh, S, et al.

U.S. Appl. No. 16/709,993, filed Dec. 11, 2019, 2020/0194273 A1, Reboh, S, et al.

U.S. Appl. No. 16/733,006, filed Jan. 2, 2020, 2020/0219762 A1, Reboh, S, et al.

U.S. Appl. No. 16/812,530, filed Mar. 9, 2020, 2020/0212179 A1, Reboh, S, et al.

U.S. Appl. No. 16/914,541, filed Jun. 29, 2020, Gaben, L, et al.

U.S. Appl. No. 14/575,329, filed Dec. 18, 2014, 2015/0179474 A1, Maitrejean, S, et al.

U.S. Appl. No. 15/852,648, filed Dec. 22, 2017, 2019/0198616 A1, Coquand, R, et al.

U.S. Appl. No. 16/732,950, filed Jan. 2, 2020, 2020/0219719 A1, Acosta Alba, P, et al.

French Preliminary Search Report dated Dec. 4, 2019 in French Application 19 09297 filed on Aug. 20, 2019 (with English Translation of Categories of Cited Documents), 2 pages.

* cited by examiner

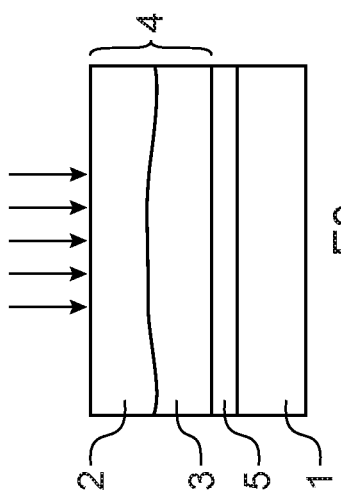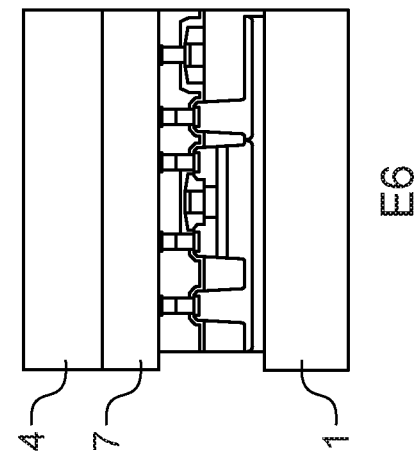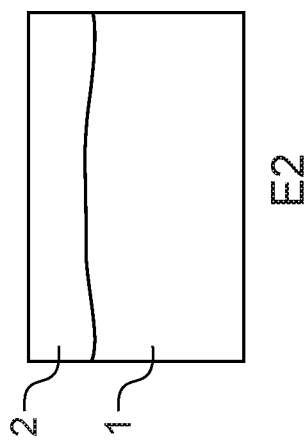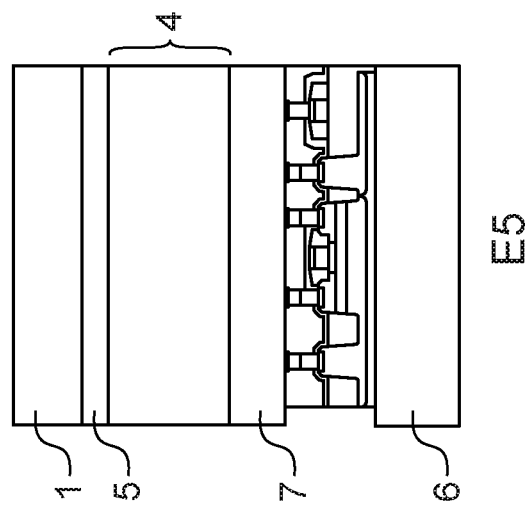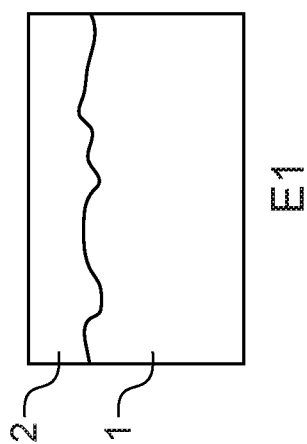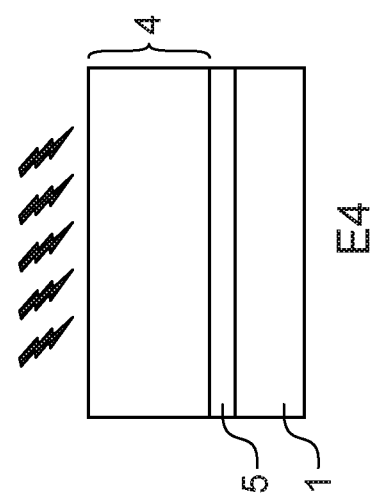

METHOD OF HEALING AN IMPLANTED LAYER COMPRISING A HEAT TREATMENT PRIOR TO RECRYSTALLISATION BY LASER ANNEALING

TECHNICAL FIELD

The field of the invention is methods of transferring a semiconducting layer from a donor substrate to a receiving substrate that make use of a fracture along a plane of weakness formed by implantation of species in the donor substrate. The invention more particularly relates to healing of defects caused by implantation.

PRIOR ART

The Smart Cut™ technology is a well-known technique for transferring thin layers of semiconducting materials. According to this technique, ion species such as hydrogen and/or helium are implanted in a donor substrate so as to form a plane of weakness. The donor substrate is then brought into contact with a receiving substrate, for example by direct bonding. This technique then makes use of the development of defects generated in the plane of weakness. This development implies an energy input, generally made by means of a heat treatment of a few hundred degrees, typically 500° C., during a few tens of minutes. This leads to the formation of a confined layer of cavities and microcracks within which a fracture will initiate and propagate. This fracture separates the donor substrate along the plane of weakness and a thin layer from the donor substrate is thus transferred onto the receiving substrate.

After the transfer, there are defects present in the transferred thin layer through which the implanted species penetrated. These defects can in particular correspond to defects in the crystalline lattice of the layer or residues of implanted species. Such defects strongly degrade functioning of electronic devices formed in or on the transferred layer. Therefore they have to be healed. The technique usually used for this healing is a high temperature heat treatment. This heat treatment generally reaches temperatures exceeding 900° C., typically 1100-1200° C. and lasts for a few seconds (about 30 seconds for Rapid Thermal Annealing (RTA) or a few minutes or even a few hours in a vertical furnace. In all cases, the entire receiving substrate on which the thin layer was transferred receives a heat treatment at well above 500° C.

Nevertheless application of this healing technique cannot be envisaged when the thin layer is transferred onto a receiving substrate that could be damaged by the application of a heat treatment at high temperature. For example, this is the case for polymer substrates used particularly in flexible electronics or on glass substrates that melt at a temperature of approximately 600° C. This is also the case for a sequential 3D integration in which substrates already have partially or fully manufactured components and therefore may comprise copper tracks that degrade starting at about 400° C.-500° C., nickel silicide contacts for which conductivity can be deteriorated at beyond 550° C., etc.

An alternative healing solution consists of generating a partial amorphisation of the transferred thin layer, usually by ion implantation. This amorphisation is followed by a Solid Phase Epitaxial Regrowth (SPER) recrystallisation annealing in the solid phase. At temperatures less than 500° C., recrystallisation by SPER annealing is very slow, or even unsuccessful, and in practice SPER annealing requires a thermal budget similar to that used to initiate the fracture. Consequently, it is impossible to implement this solution before bonding the donor substrate to the receiving substrate. Furthermore, a part of the transferred thin layer must be left without any amorphisation, to enable recrystallisation during the SPER annealing. Consequently, defects close to the bottom of the layer cannot be healed. Finally, there are difficulties with SPER recrystallisation in recrystallising the last few nanometres close to the surface due to different recrystallisation rates along the different crystalline directions and the presence of stack defects along the crystalline direction (111).

PRESENTATION OF THE INVENTION

In the context of the invention:
a technique for healing defects related to ion implantation in the donor substrate that would be used before transfer cannot treat the donor substrate at high temperature (typically at a temperature higher than 300° C.) after ion implantation, otherwise there is a risk of causing the formation of bubbles, in other words maturing of microcavities in the plane of weakness that, in the absence of an add-on stiffener on the donor substrate, would cause deterioration of its surface that could prevent bonding with the receiving substrate; and
a technique for healing defects related to ion implantation in the donor substrate that would be used after transfer cannot incorporate a heat treatment hotter than 500° C. for the reasons mentioned above.

The purpose of the invention is to disclose a solution for healing defects related to the implantation that can be made at relatively low temperature and thus be applied to the transfer of a semiconducting layer on a receiving substrate with characteristics that prevent high temperature heat treatments and that overcomes the disadvantages of the solutions discussed above.

To achieve this, the invention discloses a method of healing defects related to implantation of species in a donor substrate made of a semiconducting material to form therein a plane of weakness separating a thin layer from a bulk part of the donor substrate. This method comprises the following steps:
superficial amorphisation of the thin layer;
application of a heat treatment to the superficially amorphised thin layer;
after formation of the plane of weakness, application of laser annealing to the superficially amorphised and heat treated thin layer to recrystallise it in the solid phase.

Some preferred but non-limitative aspects of this method are as follows:
the superficial amorphisation of the thin layer is induced by ion implantation;
the laser annealing is done using irradiation of the thin layer with one or several laser pulses, the duration of the laser pulse(s) being less than a microsecond, preferably between 20 and 200 nanoseconds;
the laser pulse(s) has (have) a wave length of less than 450 nm;
the laser pulse(s) has (have) an energy density per unit area chosen to heat a front portion of the thin layer to a temperature of more than 1000° C., preferably more than 1200° C.;
the steps of superficial amorphisation of the thin layer and of application of a heat treatment to the superficially amorphised thin layer are implemented before the formation of the plane of weakness;

the steps of superficial amorphisation of the thin layer and of application of a treatment to the superficially amorphised thin layer are implemented after formation of the plane of weakness;

the steps of superficial amorphisation of the thin layer, of application of a heat treatment to the superficially amorphised thin layer and of the application of laser annealing are implemented after fracture along the plane of weakness and transfer of the thin layer onto a receiving substrate;

the thin layer incorporates an etching stop layer;

the heat treatment applied to the superficially amorphised thin layer is annealing at a temperature of less than 450° C.;

the heat treatment applied to the superficially amorphised thin layer is done during an operation to deposit a bonding layer on the donor substrate.

it comprises before the laser annealing a step of implanting electric dopants in the thin film.

The invention includes a method of transferring a thin layer from a donor substrate made of a semiconducting material to a receiving substrate, the method including steps for:

forming a plane of weakness in the donor substrate by implantation of species, said plane separating the thin layer from a bulk part of the donor substrate;

bringing the donor substrate into contact with the receiving substrate to form an assembly to be fractured;

fracturing the assembly to be fractured along the plane of weakness so as to transfer the thin layer;

characterised in that it comprises:

steps for superficial amorphisation of the thin layer and for application of a heat treatment to the superficially amorphised thin layer; and after formation of the plane of weakness and before bringing into contact, a step for application of laser annealing to the superficially amorphised and heat treated thin layer to recrystallise it in the solid phase.

The fracture typically includes a weakening heat treatment applied to the assembly to be fractured that heats the plane of weakness to a temperature higher than the temperature to which it is heated by laser annealing.

BRIEF DESCRIPTION OF THE DRAWINGS

Other aspects, purposes, advantages and characteristics of the invention will become clear after reading the following detailed description of preferred embodiments of the invention, given as non-limitative examples, with reference to the appended FIGURE on which:

FIG. 1 is a diagram of an example of the method according to the invention for transferring a thin semiconducting layer in which defects related to the implantation are healed.

DETAILED DESCRIPTION

The invention relates to a method of healing defects caused by implantation of species in a semiconducting substrate called a donor substrate, to form therein a plane of weakness separating a thin layer from a bulk part of the substrate.

The invention is used particularly to transfer the thin layer onto a receiving substrate in accordance with the Smart Cut™ technology, and more particularly onto a receiving substrate with characteristics that prevent high temperature treatments, typically at more than 500° C. In this context, the method according to the invention can heal defects present in the thin layer before it is transferred onto the receiving substrate. The method according to the invention can also heal defects present in the thin layer after its transfer onto the receiving substrate.

The following describes different steps E1-E6 in a method for transferring a thin layer from a donor substrate made of a semiconducting material to a receiving substrate wherein the healing method according to the invention is used before the transfer, with reference to FIG. 1. It is understood that such healing can similarly be done after transfer, independently or in addition to healing before transfer.

The method begins with a step to supply the donor substrate 1 that may be a silicon substrate, or any other semiconducting material. Examples include silicon-germanium, germanium or a III-V material.

In a step E1, the donor substrate 1 is subjected to a superficial amorphisation step, for example using an implantation of heavy ions, to form an amorphous superficial zone 2 that will form a front portion of the thin layer to be transferred.

This implantation may in particular be based on one or several of the following species: silicon, germanium, phosphorus, arsenic, nitrogen or argon with a dose of typically between $10^{14}$ and $10^{16}$ at/cm$^2$. For example, with a dose of $2 \times 10^{15}$ at/cm$^2$, an implantation of germanium results in an amorphised depth varying from 4.7 nm to 10.6 nm for an implantation energy varying from 1 keV to 3.5 keV.

In a step E2, a low temperature annealing is applied to the donor substrate that will anneal the superficially amorphised thin layer. This annealing smooths the interface between the amorphous zone 2 and the crystalline substrate 1. This smoothing annealing is typically done at a temperature of less than 450° C., which enables the healing method according to the invention to be performed after transfer. This annealing is generally done at a temperature higher than 200° C., preferably at a temperature between 300° C. and 450° C.

In one variant embodiment, the heat budget of this smoothing annealing is added during an operation to deposit a bonding layer, for example made of an oxide or a nitride, onto the donor substrate. This bonding layer is chosen so as to not hinder the subsequent recrystallisation in the solid phase of the amorphous zone made by laser annealing. The bonding layer can thus be made of a material with low absorption of radiation from the laser beam (for example silicon oxide, silicon nitride or any other material with an absorption of less than 10% in the wavelength range of the laser beam) or it may be sufficiently thin such that the majority of the energy brought in by the laser is absorbed by the amorphous zone (namely for most semiconductors, a thickness typically less than 20 nm, and preferably less than 10 nm).

In one variant, the method includes an operation to deposit a bonding layer independent of the smoothing annealing. It should be noted that if the deposition temperature is more than 500° C., recrystallisation of the amorphous zone will occur during the deposit. It is then necessary to have a larger amorphisation depth so that this recrystallisation is only partial. It is then found that if the deposition temperature is low enough, typically <200° C., then this deposition operation can be done indifferently before or after the implantation of light ions in the next step.

The method then includes a step E3 to form a plane of weakness 5 in the thickness of the donor substrate. This plane of weakness is formed more particularly by submitting a front surface of the donor substrate to an implantation of light ions, typically hydrogen and/or helium. The plane of weakness 4 delimits a thin layer 4 and a bulk part of the donor substrate 1. The species pass through the thin layer 4 during implantation and cause defects in it that need to be healed. This plane of weakness is typically between 250 and 300 nm under the surface. This depth can be adjusted by varying the implantation conditions and more particularly the implantation energy. This depth is chosen in particular such that the amorphous zone 2 remains at a distance from the plane of weakness 5, preferably by more than 100 nm, or even more than 150 nm, to avoid hindering subsequent propagation of the fracture wave. The thin layer thus comprises a front portion composed of the amorphous zone 2 and a back portion composed of the crystalline material in contact with the plane of weakness.

The method then comprises a step E4 during which laser annealing is applied to the superficially amorphised thin layer 4 to recrystallise it in the solid phase. This laser annealing makes it possible in particular to recrystallise the amorphous zone 2 of the thin layer 4 in the solid phase. Recrystallisation in the solid phase can heal defects present in the thin layer due to the implantation in step E3.

This laser annealing is an in-depth selective annealing that causes heating of the thin layer with an intensity that decreases with the depth from a front face of the semiconducting layer towards the plane of weakness and is therefore maximum close to the front face. This decrease in the intensity of heating makes it possible to use preferential heating of the damaged zone through which implantation of light ions takes place at very high temperature so that defects related to the implantation can be healed. And since the temperature rise is confined in a front portion of the thin layer, the plane of weakness is not heated, that which avoids the formation of bubbles. A back portion of the thin layer in contact with the plane of weakness may not be healed, due to the selectivity of the annealing depth.

Thus, in the framework of the Smart Cut™ method, this local annealing will not generate any bubble formation and therefore can be done before the donor and receiving substrates are bonded, the weakening heat treatment of the plane of weakness that leads to transfer of the semiconducting layer that can then be done a posteriori. The thin layer is then healed before it has been transferred. In this way, the only temperature imposed on the receiving substrate that can be sensitive to temperature is the weakening heat treatment, that is done at a sufficiently low temperature (typically less than 500° C.) and/or for a sufficiently short period to guarantee the integrity of the receiving substrate or of its components.

After healing, the method includes bringing the donor substrate into contact with a receiving substrate 5 to form an assembly to be fractured, during a step E5. This formation can be made by direct assembly, for example by molecular bonding, possibly by means of a bonding layer 7. As shown on FIG. 1, the receiving substrate 6 may comprise previously manufactured electronic devices.

Then, after contact has been made, the method includes a step E6 to fracture the assembly to be fractured along the plane of weakness 5 that leads to detachment of the thin layer 4 from the donor substrate and its transfer to the receiving substrate. This fracture includes a weakening heat treatment applied to the assembly to be fractured. This heat treatment provides sufficient energy so that a fracture wave propagates in a self-sustained manner, once it has been initiated. In a first variant, the weakening heat treatment alone is sufficient to initiate the fracture wave. In a second variant, the transfer method comprises additional local energy input after or during the weakening heat treatment to initiate the fracture wave. This energy may be of mechanical or thermal origin, or any other origin. It may for example be local heating done by a laser or by input of ultrasound energy.

The semiconducting layer may then be thinned so as to keep only a useful thickness corresponding at most to the healed front portion. In the example represented, a crystalline thin layer was transferred onto the receiving substrate and can act as a new level for manufacturing of electronic devices in the framework of a sequential 3D integration.

In one possible embodiment, before superficial amorphisation, the thin layer may integrate an etching stop layer, that will be used after transfer to result in thinning. This can be done by epitaxial growth of the stop layer (for example made of SiGe) on the donor substrate (for example made of Si) then epitaxial growth of the material of the thin layer (for example made of Si). In this case, the amorphisation depth can be less than (preferably) or more than the depth at which this stop layer is located. The light ions are implanted so as to create the plane of weakness at a depth greater than the depth of the stop layer.

In one possible embodiment, it is possible to electrically dope all or part of the zone which is amorphous or which will be amorphized with conventional dopants such as boron, phosphorus or even arsenic. The dopant implantation is advantageously carried out before the laser annealing step E4 so as to reduce the temperature of the laser annealing and/or to increase the recrystallization rate. By way of example, the implantation of dopants can be carried out either before or after step E1 of amorphization or step E2 of smoothing annealing.

Thus, the transfer process comprises healing of defects in the thin layer related to implantation of species, before the donor and receiving substrates are brought into contact. As indicated above, this healing comprises local annealing of the donor substrate provoking heating of the thin layer, the intensity of which is maximum on the surface and decreases from the front face of the thin layer in the direction of the plane of weakness 5. This in-depth selective annealing can be made in particular by applying laser irradiation to the front surface of the donor substrate. The laser irradiation may be done at atmospheric pressure or under a vacuum, preferably under an inert atmosphere or under a reducing atmosphere.

The laser irradiation is preferably a pulse irradiation for which the operating conditions are chosen to heat the amorphous zone 2 of the thin layer without causing the formation of bubbles in the plane of weakness 5.

In particular, the laser irradiation wavelength is preferably chosen to result in strong absorption of radiation by the material of the donor substrate. In this way, the essential part of the radiation transferred to the implanted donor substrate can be absorbed in the first nanometres, typically in the first 50 nm of material. For example, a laser with a wavelength of less than 450 nm is chosen in the case in which the donor substrate is made of silicon, germanium or silicon-germanium.

The duration of a laser pulse is chosen to be sufficiently short so that heat deposited in the first nanometres does not have time to significantly diffuse in depth as far as the plane of weakness 5, otherwise bubble formation will occur. For example, in the case of a donor substrate with a plane of weakness located at a depth of between 150 and 1500 nm from the front face of the thin layer, the pulse duration is chosen to be less than one microsecond, typically between 20 and 200 ns.

Other operating conditions of the laser irradiation that can be controlled are the energy density per unit area and the number of pulses irradiating the same surface region. These other conditions are chosen so as to reach a sufficient temperature so that the healed front portion of the thin layer is at least as thick as the useful thickness of the semiconducting layer in the final component. For example, it may be decided to transfer a thin layer with a thickness of 250 nm so that in fine all that is kept is the last nanometres (5 to 30 nm for a very thin useful layer, or 50 to 150 nm for a thicker useful layer). The laser annealing thus heals the crystal on this useful thickness of the thin layer. For a silicon donor substrate, the energy density is then chosen to exceed 1000° C., and even better 1200° C., throughout the entire useful thickness.

In order to achieve recrystallisation in the solid phase, laser annealing is done in an under-melting regime by which laser irradiation comprises one or several pulses, each with an energy density chosen to not cause melting of the irradiated surface.

In one possible embodiment, the temperature of the donor substrate is elevated before and during laser annealing by means of a heating element configured to heat the entire donor substrate to a temperature chosen so as to not cause any bubble formation in the plane of weakness, for example at a temperature of between 50° C. and 450° C., and preferably between 100° C. and 350° C.

Due to a sufficiently short laser annealing (less than one microsecond) and a carefully selected wavelength (less than 600 nm), the invention limits surface heating to a volume very close to the surface of the donor substrate. This means that the damaged zone through which ion implantation occurred is heated preferentially over a depth dependent on the wavelength and the duration of the laser pulse. This method can be used to rise to very high temperatures in the front portion of the thin layer, while confining this heating to avoid causing the formation of bubbles in the plane of weakness 4. In addition to healing defects related to implantation and thus to restore the initial electrical properties of the semiconducting material, these high temperatures can also enable activation of dopants or other high temperature heat treatments that cannot be used with substrates that might be damaged. Due to the use of laser annealing even before bonding, constraints related to thermal budget limitations, for example such as the need to have a thermally insulating layer, can be overcome.

In one possible embodiment, the laser annealing can irradiate a variable size surface area that can vary between a few mm$^2$ and a few cm$^2$. The shape and size of this surface can be controlled using masks. Part of the substrate rather than other parts is thus annealed preferentially so that the thin layer can be locally healed.

The above describes a pretransfer healing method wherein the steps for superficial amorphisation of the thin layer and application of a heat treatment on the superficially amorphised thin layer are implemented before formation of the plane of weakness and wherein the laser annealing application step is implemented after formation of the plane of weakness.

According to an alternative pretransfer healing method, these three steps of superficial amorphisation, application of a heat treatment and application of laser annealing are implemented after formation of the plane of weakness. The heat treatment application step is then done at a temperature chosen to not cause the formation of bubbles in the plane of weakness, for example at a temperature of less than 300° C.

As indicated above, the invention includes a post-transfer healing method wherein the steps for superficial amorphisation of the thin layer, application of a heat treatment to the superficially amorphised thin layer and application of laser annealing are implemented after fracture along the plane of weakness and transfer of the thin layer onto a receiving substrate.

The invention claimed is:

1. A method of healing defects caused by implantation of species in a donor substrate made of a semiconducting material to form therein a plane of weakness separating a thin layer from a bulk part of the donor substrate, said method comprising:
   causing the thin layer to be superficially amorphous;
   applying a heat treatment to the superficially amorphous thin layer;
   after formation of the plane of weakness, applying a laser annealing to the superficially amorphous and heat treated thin layer to recrystallise it in the solid phase, wherein:
   the causing the thin layer to be superficially amorphous comprises ion implantation of heavy ions; and
   the heat treatment applied to the superficially amorphous thin layer is an annealing at a temperature of less than 450° C. in order to smooth the interface between the amorphous zone and the crystalline substrate.

2. The method according to claim 1, wherein applying the laser annealing comprises irradiating the thin layer with one or several laser pulses, the duration of the laser pulse(s) being less than a microsecond.

3. The method according to claim 2, wherein the laser pulse(s) has (have) a wavelength of less than 450 nm.

4. The method according to claim 2, wherein the laser pulse(s) (has) have a surface energy density chosen to heat a front portion of the thin layer to a temperature of more than 1000° C.

5. The method according to claim 1, wherein the causing the thin layer to be superficially amorphous and the applying a heat treatment to the superficially amorphous thin layer are implemented before the formation of the plane of weakness.

6. The method according to claim 1, wherein the causing the thin layer to be superficially amorphous and the applying a heat treatment to the superficially amorphous thin layer are implemented after the formation of the plane of weakness.

7. The method according to claim 1, wherein the causing the thin layer to be superficially amorphous, the applying a heat treatment to the superficially amorphous thin layer and the applying the laser annealing are implemented after fracture along the plane of weakness and transfer of the thin layer onto a receiving substrate.

8. The method according to claim 1, wherein the thin layer incorporates an etch stop layer.

9. The method according to claim 1, wherein the heat treatment applied to the superficially amorphous thin layer is performed during an operation to deposit a bonding layer on the donor substrate.

10. The method according to claim 1, further comprising, before the laser annealing, implanting electrical dopants in the thin film.

11. The method of transferring a thin layer from a donor substrate made of a semiconducting material to a receiving substrate, the method including:
    causing the thin layer to be superficially amorphous;
    applying a heat treatment to the superficially amorphous thin layer to form a superficially amorphous and heat treated thin layer;

forming a plane of weakness in the donor substrate by implantation of species, said plane separating the thin layer from a bulk part of the donor substrate;

after forming the plane of weakness, applying a laser annealing to the superficially amorphous and heat treated thin layer to recrystallise it in the solid phase;

bringing the donor substrate and the receiving substrate into contact to form an assembly to be fractured;

fracturing the assembly to be fractured along the plane of weakness so as to transfer the thin layer;

wherein:

the causing the thin layer to be superficially amorphous comprises ion implantation of heavy ions; and the heat treatment applied to the superficially amorphous thin layer is an annealing at a temperature of less than 450° C. in order to smooth the interface between the amorphous zone and the crystalline substrate.

12. The method according to claim 11, wherein said fracturing includes a weakening heat treatment applied to the assembly to be fractured that heats the plane of weakness to a temperature higher than a temperature to which it is heated by the laser annealing.

13. The method according to claim 2, wherein each laser pulse has the same wavelength.

* * * * *